United States Patent
Brezoczky et al.

(10) Patent No.: US 6,620,250 B2
(45) Date of Patent: Sep. 16, 2003

(54) METHOD AND APPARATUS FOR SHIELDING A DEVICE FROM A SEMICONDUCTOR WAFER PROCESS CHAMBER

(75) Inventors: Thomas B. Brezoczky, San Jose, CA (US); Randy Schmieding, Saratoga, CA (US); Gene Y. Kohara, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/037,997

(22) Filed: Nov. 9, 2001

(65) Prior Publication Data

US 2002/0166632 A1 Nov. 14, 2002

Related U.S. Application Data

(63) Continuation of application No. 09/513,277, filed on Feb. 24, 2000, now abandoned.

(51) Int. Cl.[7] .............................. C23C 16/00; B01D 8/00
(52) U.S. Cl. ......................... 118/715; 432/253; 62/55.5; 417/901
(58) Field of Search ........................ 62/55.5; 417/901; 118/715; 432/253, 254, 254.2

(56) References Cited

U.S. PATENT DOCUMENTS

| | | | | |
|---|---|---|---|---|
| 5,151,013 A | * | 9/1992 | Moore | 416/221 |
| 5,548,964 A | * | 8/1996 | Jinbo et al. | 62/55.5 |
| 6,000,415 A | * | 12/1999 | Huo et al. | 137/1 |
| 6,448,492 B1 | * | 9/2002 | Okada et al. | 174/35 MS |

* cited by examiner

*Primary Examiner*—Shrive P. Beck
*Assistant Examiner*—Sylvia R MacArthur
(74) *Attorney, Agent, or Firm*—Moser, Patterson & Sheridan LLP

(57) ABSTRACT

A method and apparatus for shielding a device, such as a pump, from a process chamber of a semiconductor wafer processing system. The apparatus comprises a shield connected to a mounting portion. The mounting portion has a fluid passage wherein the temperature of the apparatus is regulated by flowing fluid through the passage.

22 Claims, 3 Drawing Sheets

METHOD AND APPARATUS FOR SHIELDING A DEVICE FROM A SEMICONDUCTOR WAFER PROCESS CHAMBER

CROSS REFERENCE TO RELATED APPLICATION

This application is a continuation of U.S. patent application Ser. No. 09/513;277, filed Feb. 24, 2000 now abandoned and herein incorporated into the present continuation application by reference.

BACKGROUND OF THE DISCLOSURE

1. Field of the Invention

The present invention relates to semiconductor wafer process chambers and, more particularly, to a heat shield for shielding a device such as a pump from thermal energy generated within a semiconductor wafer process chamber.

2. Background of the Invention

To produce a sufficient vacuum for processing semiconductor wafers in a process chamber of a semiconductor wafer processing system, a first and second stage pump down is performed. Generally, in the first stage, the chamber is evacuated and brought to a first vacuum level. After the bulk of the atmosphere has been removed from the chamber and a vacuum is established, the second stage is initiated. During the second stage, a cryogenic pump (commonly referred to as a cryo pump) is used to attain a high vacuum level within the process chamber. Systems that utilize cryo pumps to achieve high vacuums include physical vapor deposition (PVD) systems that require base pressures (i.e., without back filling will sputtering gases) on the order of $10^{-9}$ Torr, to obtain optimal process conditions and process performance.

Generally, the cryo pump develops a high vacuum within the chamber by removing molecules and other gases remaining in the chamber atmosphere after the first stage pump down. The cryo pump typically comprises a plurality of vane arrays. Each vane in each array is fabricated from a material, that when at a low temperature, adsorbs molecules and other gases that come in contact with the vane during the pumping process. It should be noted that only a finite number of molecules can be adsorbed by the cryo pump, making the capacity pump sensitive to loading from sources other than chamber atmosphere. At a point in processing, preferably after a relatively large number of wafers have been processed in the vacuum environment, the cryo pump is heated to discharge, i.e., desorb or off-gas, the collected molecules and other gases adsorbed during pumping. Generally stated, the cryo pump adsorbs gases when cold, then progressively loses its ability to adsorb gases as the cryo pump temperature increases, until reaching a temperature where the cryo pump desorbs gases. As such, the temperature of the pump directly effects the ability of the cryo pump to achieve and maintain high vacuum (i.e., the cryo pump must remain cool to efficiently achieve high vacuum).

Typically, the cryo pump is connected to a port in the process chamber via an elbow conduit. The elbow conduit functions to protect the cryo pump from heat generated in the chamber by lamps, pedestal heaters, plasma and other heat sources within the chamber. The elbow conduit thermally "isolates" the cryo pump by placing the cryo pump at a distance from the chamber where the heating effects from the chamber are less severe. Additionally, the "elbow" shape of the conduit positions the cryo pump out of direct incidence of radiant energy exiting the chamber through the port. The port is also typically fitted with a shield to reflect radiant energy generated within the process chamber.

Before a process chamber is used to process semiconductor wafers, the chamber goes through a process known as "bakeout", where the chamber is heated by lamps to desorb and evaporate any volatile particles from the surfaces exposed to the interior of the chamber. The removal of these particles is important to both the ability to achieve a high vacuum and to minimize contamination of substrates processed within the chamber.

Once the volatile particles have been pumped from the chamber, the chamber is allowed to cool to a nominal temperature over a period of time known as the cooldown period. A chamber is considered "qualified" for processing wafers when the chamber achieves and can maintain a vacuum on the order of $8\times10^{-9}$ to $5\times10^{-9}$ Torr after both bakeout and cooldown cycles are complete.

A number of problems have been identified in systems utilizing cryo pumps that contribute to difficulty in achieving and maintaining high vacuums. One problem is the difficulty in desorbing volatiles and other contaminants from the elbow conduit. The position of the elbow conduit intermediate of the chamber and cryo pump impedes the heating of the elbow's surfaces required to remove contaminants from the elbow conduit during bakeout. As a result, the elbow conduit may outgas material that loads the cryo pump before a high vacuum is achieved, i.e., it may continue to outgas at a relatively high rate when outgassing of the chambers surfaces reaches a relatively low rate. Furthermore, the curved geometry of the elbow conduit causes molecules and other contaminates to impinge on the elbow conduit's interior when exiting the chamber through the port. These molecules and contaminants later become dislodged and cause the cryo pump not to be able to reach the desire vacuum level or cause the vacuum pressure to drift due to molecular loading of the cryo pump from outgassed elbow materials.

Another problem is that the heat shield is typically fabricated from aluminum. The aluminum heat shield heats rapidly, and eventually becomes a heat source relative to the cryo pump due to the shield's proximity to the pump. Fluid channels within the aluminum shield, or the shield mounting flange for cooling have been disfavored since fluid channels located within the vacuum environment may result in catastrophic chamber contamination if fluid were to leak.

These problems aggregate to cause long qualifying times during chamber bakeout and inhibit the ability of the cryo pump to reach and maintain high vacuum levels. This results in reduced tool capacity, and consequently less product throughput and increased production costs.

Therefore, there is a need in the art for a heat shield that enhances the performance of a cryo pump by shielding the pump from thermal energy generated within a semiconductor wafer process chamber.

SUMMARY OF THE INVENTION

The disadvantages heretofore associated with the prior art are overcome by the present invention of apparatus, positioned at an inlet port of a device such as a cryo pump, for shielding the cryo pump from a process chamber of a semiconductor wafer processing system. Specifically, the apparatus comprises a shield member coupled to a mounting flange. The mounting flange comprises a fluid passage positioned outside of a sealing area such that a seal failure will not result in contamination of the process chamber. The fluid passage is adapted for flowing a fluid to transfer heat to/from the shield member.

In one aspect of the invention, the inventive apparatus reflects thermal energy generated within the process chamber while transferring thermal energy absorbed by the heat shield to a heat transfer fluid. Thus the inventive shield allows the cryo pump to be mounted close to the chamber while allowing for high vacuum to be maintained in the chamber through increased efficiency of the cryo pump.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the Figures.

DETAILED DESCRIPTION

Figure 1:
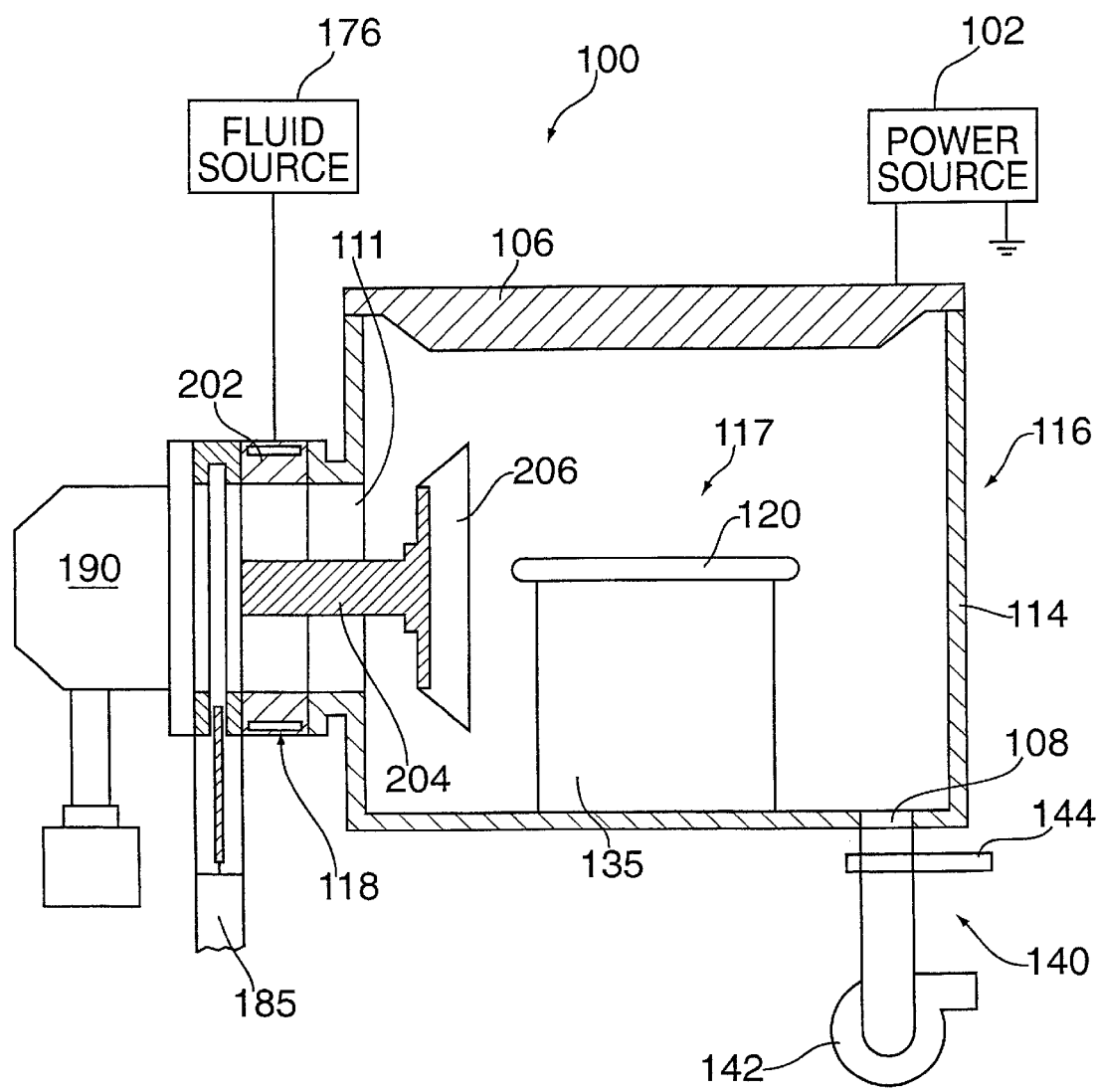
FIG. 1 is a schematic, cross sectional view of a process chamber incorporating the present invention of a heat shield assembly.

FIG. 1 is a simplified schematic drawing illustrating a heat shield assembly 118 of the present invention incorporated in a semiconductor wafer processing system 100. The invention effectively shields a device from thermal energy generated within a process chamber 116 of the semiconductor process system 100. The invention is generally applicable to vacuum chambers of semiconductor wafer processing systems, including, for example, physical vapor deposition (PVD) or sputtering chambers, chemical vapor deposition (CVD) chambers, high temperature chambers (HTC) and other chambers wherein thermal shielding of a device is desired.

By way of example, FIG. 1 schematically illustrates a PVD or sputtering system 100. The system 100 comprises a cryogenic pump (cryo pump) 190, a rough pump assembly 140, a process chamber 116, a heat shield assembly 118 and a fluid source 176.

The exemplary process chamber 116 includes a chamber wall 114 and a target plate 106. The target plate 106 is disposed on top of the chamber wall 114 and encloses the process chamber 116. The plate 106 is electrically insulated from the chamber walls 114 by an annular insulator (not shown). Generally, to ensure the integrity of the vacuum in the chamber 116, O-rings (not shown) are used above and below the insulator to provide a vacuum seal. The target plate 106 may be fabricated of a material that will become the deposition material or it may contain a coating of the deposition material. To facilitate the sputtering process, a high voltage DC power supply 102 is connected between the target 106 and the chamber walls 114.

The chamber walls 114 and the target 106 define a chamber volume 117. The chamber wall 114 additionally comprises a first port 108 and a second port 111. The first port 108 is fluidly coupled to the rough pump assembly 140. The rough pump assembly 140 typically comprises a shut off valve 144 and a rough pump 142. The shut off valve 144 is coupled between the rough pump 142 and the first port 108. The shut off valve 144 is actuated to isolate the rough pump 142 from the chamber volume 117, for example, when a first level of vacuum is reached in the chamber 116.

The second port 111 places the chamber volume 117 in fluid communication with the cryo pump 190. A shut off valve 185 is coupled between the second port 111 and the cryo pump 190. The shut off valve 185 isolates the cryo pump 190 when the pump is not in use.

A pedestal 135 is disposed within the chamber 116 to retain and support a substrate 120. The pedestal 135, that may be heated, is raised and lowered by an elevator system (not shown) to position the substrate 120 relative to the target plate 106.

The shield assembly 118 is disposed adjacent the second port 111 of the process chamber 116 to shield the cryo pump 190. Alternately, the shield assembly may be used to shield other devices sensitive to temperature, such as probes, sensors, and so forth. The shield assembly 118 comprises a mounting portion 202 coupled to a heat shield 206 by a support member 204. The mounting portion 202 is connected to the chamber wall 114 while the heat shield is positioned within the chamber volume 117.

Figure 2:
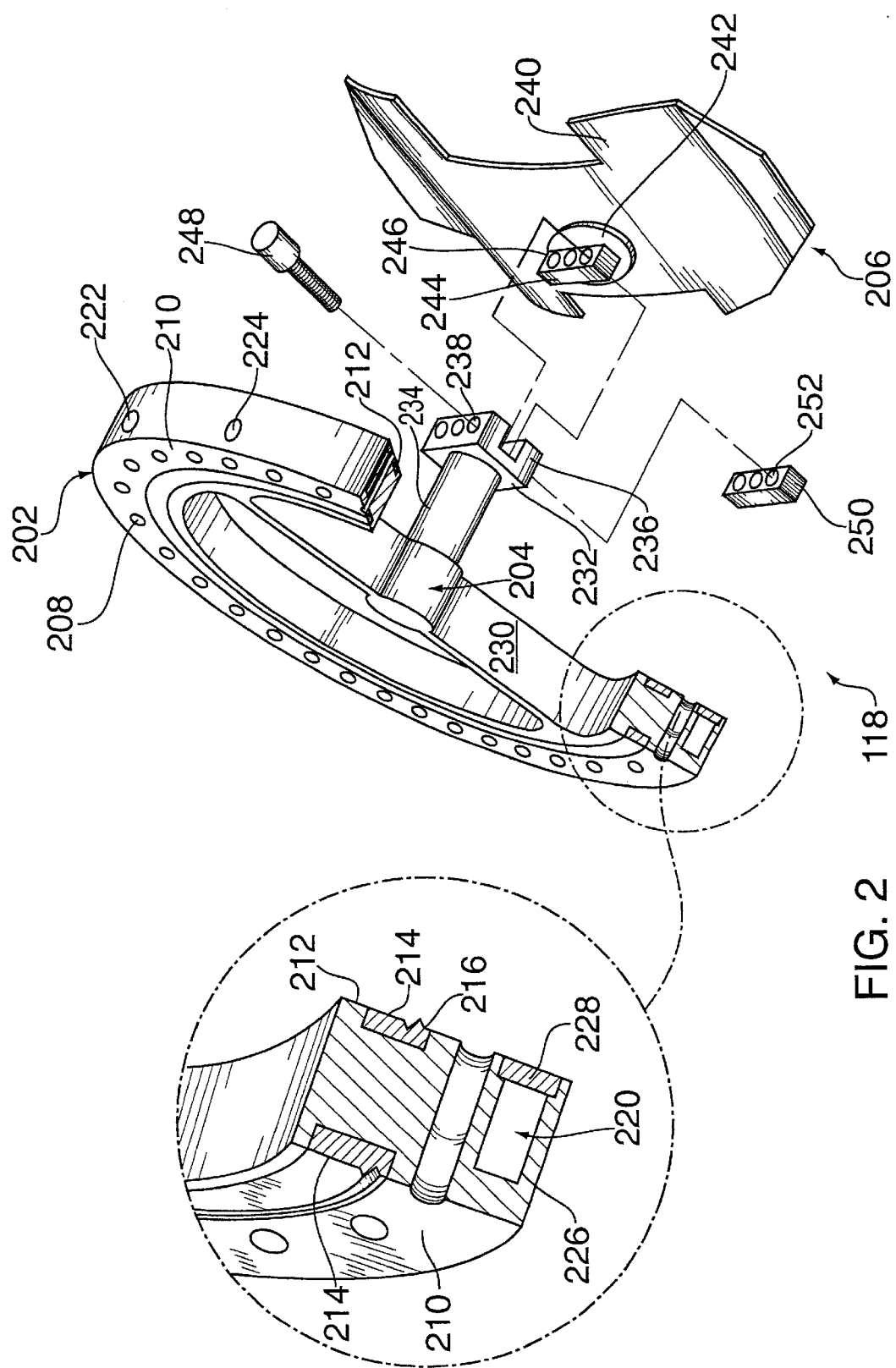
FIG. 2 depicts an exploded, perspective view of the heat shield assembly of FIG. 1.

FIG. 2 depicts an exploded perspective view of the shield assembly 118. The mounting portion 202 that in the first embodiment is depicted as a mounting flange, is generally fabricated from a thermally conductive material, for example, copper. The mounting portion 202 generally comprises, in the preferred embodiment, a generally annular ring configured to have the same circumferential profile as the chamber opening to which it is mounted, with a first face 210 and an opposed second face 212. A plurality of mounting holes 208 pass through the mounting portion 202 equally spaced on a bolt circle. A groove 216 is provided on both the inner face 210 and the outer face 212, radially inwards of the mounting holes 208. The groove 216 in each of such faces 210, 212 is provided for receiving a seal ring 217. The seal ring 217 has a sealing face 214 that is exposed generally co-planar with the faces 210, 210 of the mounting portion 202. A knife edge 216 extends outwardly from the sealing face 214 about the exposed circumference of the seal ring 217. The seal ring 217 is fabricated from a material such as stainless steel. Generally, the material of the seal ring 217 is selected to be harder than the material a gasket (306 and 308, see FIG. 3) used between the shield assembly 118 and adjacent components to ensure reliable sealing and reuse after disassembly of the shield assembly 118 from the process chamber 116. The seal ring 217 is preferably affixed within the groove 215 by vacuum brazing although other gas tight sealing methods such as adhesives and interference fits may alternately be utilized.

Disposed radially outwards from the mounting holes 208 and within the mounting portion 202 is a fluid passage 220, and thus positioned entirely radially outward from the position of the seal ring 217. The fluid passage 220 substantially circumscribes the mounting portion 202, beginning at an inlet 222, extending within the circumference of the mounting portion 202 outward of the bolt circle and ending in an outlet 224. The inlet 222 and outlet 224 are preferably threaded with an NPT or other thread form to accept a commercial fluid connector therein (not shown). The fluid passage is coupled through the inlet 222 and the outlet 224 to a fluid source 176 (shown in FIG. 1), from which fluid is provided to flow through the fluid passage 220. The fluid regulates the temperature of the shield assembly 118 by drawing heat (or alternately introducing heat, depending upon whether heating or cooling of the shield assembly 118 is desired) conducted through the mounting portion 202 into the fluid. As the fluid is circulated through the mounting portion 202 from the fluid source 176, the amount of heat removed form the shield assembly 118 is controlled by changing the fluid, fluid flow rate or inlet temperature of the fluid, thus permitting the shield assembly 118 to be maintained at a predetermined temperature.

The fluid, which may be liquid and/or gaseous fluids, in one embodiment is a liquid such as de-ionized water and/or ethylene glycol. Other fluids, such as liquid or gaseous nitrogen or freon, can also be used.

The fluid passage 220, in one embodiment, is fabricated by forming a channel 226 in the second face 212 of the mounting portion 202. A plug 228 is then fitted in the channel 226 flush with the second face 212 to form the fluid passage 220. The plug 228 is affixed to the channel 226 in a manner that prevents leakage of fluids flowing within the fluid passage 220, for example, using interference fits, adhesives, welding, brazing, and other methods to connect these parts.

The support member 204 is generally fabricated from a material having good thermal conductance, for example, copper. The support member 204 supports the heat shield 206 while minimizing the projected area obstructing the flow path of the gases passing through the second port 111. The support member 204 comprises a cross member 230, a support rod 234 and a mounting block 232. The cross member 230 is coupled on its ends to the mounting portion 202 and preferably extends co-linearly with a diameter of the generally circular mounting portion 202. The support rod 234 extends perpendicularly from the cross member 230, preferably midway between the end of the cross member 230, and terminates at the mounting block 232.

The mounting block 232 is generally rectangular in shape and includes a slot 236 positioned opposite the connection of the mounting block 232 with the support rod 234. The mounting block 232 additionally has a plurality of holes running through the mounting block 232 orthogonal to and spaced about the slot 236.

The heat shield 206 is generally fabricated from a good thermal conductor, for example, copper. The heat shield 206 has a thermally reflective finish. In one embodiment, the heat shield 206 is finished with metal plating, such as nickel, gold, silver or other thermally reflective materials. In all cases, the reflective finish must be chosen such that the emmissivity is low at operating temperatures and wavelengths. The heat shield 206 has a shield member 240 and a mounting pad 242. The shield member 240 has a generally curved form concentric to the circumferential edge of the pedestal 135 to reflect heat away from the cryo pump 190 (as seen in FIG. 1).

The mounting pad 242 is centrally positioned on the shield member 240. The mounting pad 242 comprises an outwardly projecting tab 244. The tab 224 contains a plurality of holes 246. The tab 224 interfits with the slot 236 such that the holes 238 and 246 align. A fastener, such as a cap screw 248, is passed through the holes 238 and 246, and into a threaded hole 252 of a mounting plate 250, thus securing the heat shield 206 to the shield assembly 118. In this manner, the coupling of the mounting pad 242 and the slot 236 in the mounting block 232 enable heat transfer to occur efficiently between the heat shield 206 and support member 204.

Figure 3:
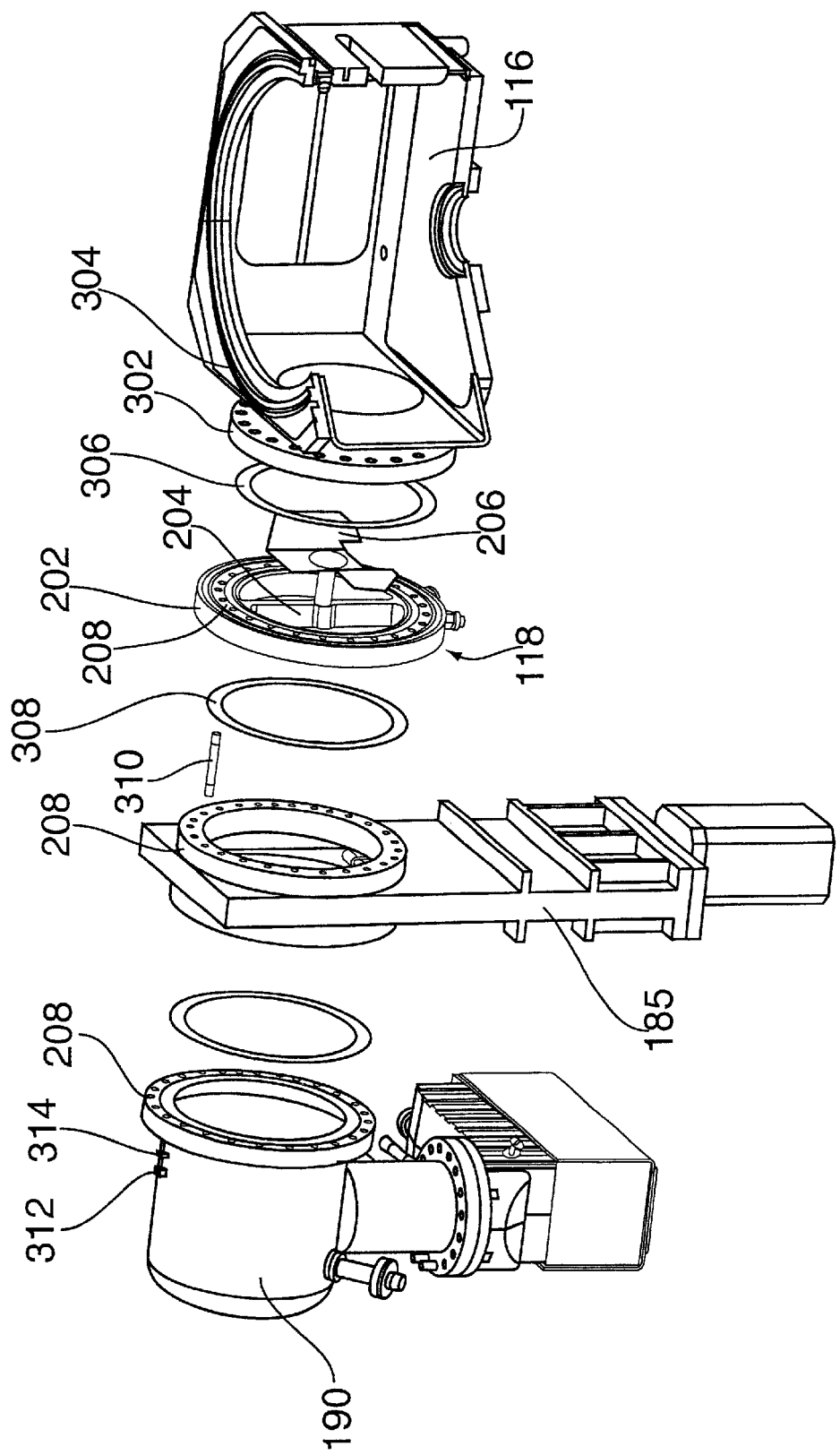
FIG. 3 depicts a simplified, exploded view of a cryo pump connection with the process chamber of FIG. 1.

FIG. 3 depicts an exploded view of a chamber body, valve and pump, including the cryo pump 190, the shut off valve 185, and the shield assembly 118 to the second port 111 of the process chamber 116. The reader is encouraged to simultaneously refer FIG. 2 and FIG. 3 for the best understanding of the invention.

Progressing from the process chamber 116 to the cryo pump 190, the process chamber 116 has a flange 302 that circumscribes the second port 111. The flange 302 contains a plurality of threaded holes 304 set in a bolt circle identical to the bolt circle of the plurality of holes 208 in the mounting portion 202. A threaded stud 310 is partially disposed into each threaded hole 304 so that the majority of stud 310 projects outward from the flange 302. Only one of threaded stud 310 is shown in FIG. 3 for clarity. The shut off valve 185 and the cryo pump 190 also have a plurality of holes 208 identical to those found in the mounting portion 202. The mounting portion 202, the shut off valve 185, and the cryo pump 190 are disposed upon the threaded stud 310 wherein the threaded stud 310 passes through the mounting holes 208 of the respective components.

A first, deformable gasket 306 having minimal outgasing characteristics under vacuum and elevated temperature conditions is disposed between the mounting portion 202 and the flange 302. A second gasket 308 is similarly disposed between the mounting portion 202 and the shut off valve 185. The first gasket 306 is compressed between the sealing face 214 and knife edge 216 of the seal ring 217 and the flange 302 while the second gasket 308 is compressed between the sealing face 214 and knife edge 216 of the seal ring 217 and the shut off valve 185 by tightening a nut 312 on the stud 310. A lock washer 314 is disposed between the nut 312 and the cryo pump 190 to prevent the nut 312 from loosening. When the gaskets 306 and 308 are compressed, the knife edge 216 of the sealing surfaces 214 make point contact with the respective gaskets, thus ensuring a seal between the components.

Referring primarily to FIG. 1 and FIG. 3, in operation, processing of a substrate 120 begins with placing the substrate 120 upon the pedestal 135. The process chamber 116 is evacuated using the rough pump assembly 140. The bulk of the gases within chamber volume 117 are removed by the rough pump 142 and the first vacuum level is obtained within the process chamber 116. The shut off valve 144 is then activated to isolate the chamber volume 117 from the rough pump 142. Once the first vacuum level has been obtained, the shut off valve 185 is opened and the cryo pump 190 is activated to further increase the vacuum level.

During the pump down process, and the subsequent substrate processing, thermal energy is generated from an array of sources including lamps, plasma, pedestal heaters and other heat sources. A portion of this heat is radiated to the shield member 206. The reflective finish of the shield member 206 reflects a portion of this thermal energy back into the process chamber 116 and away from the cryo pump 190. The thermal energy absorbed by the shield member 206, including the portion of un-reflected radiant energy, is conducted from the shield member 206, through the support member 204 and into the mounting portion 202. The thermal energy is then transferred to the fluid circulating through the fluid passage 220 in the mounting portion 202 from the fluid source 176, and thus, out of the mounting portion 202. As such, the heat shield assembly 118 provides thermal regulation and substantially protects, i.e., shields, the cryo pump 190 from the thermal effects from the process chamber 116. Thus, the cryo pump 190 remains cool enough to achieve vacuum levels in excess of $10^{-9}$ Torr.

If the exhaust port region requires heating, then heated fluid is passed through the shield. The thermal energy is transferred from fluid to the mounting portion 202, through the support member 204 and into the shield member 220. Heating the shield assembly 118 may assist in heating the cryo pump 190 during the pumps discharge cycle. Additionally, heating the shield assembly 118 protects the exhaust port region from being contaminated with deposition material or reaction by-products by minimizing condensation on adjacent surfaces. Minimizing the deposition of contaminants in the exhaust port region extends the service life of probes, sensors or other devices positioned in this region that may be sensitive to contamination due to deposition of material or by-products.

Although various embodiments which incorporate the teachings of the present invention have been shown and described in detail herein, those skilled in the art can readily devise many other varied embodiments that still incorporate the teachings disclosed herein without departing from the spirit of the invention.

What is claimed is:

1. Apparatus for shielding a device from a process chamber environment of a semiconductor wafer processing system, comprising:
   a shield;
   a thermally conductive support member attached to said shield, extending perpendicularly away from said shield; and
   an annular mounting portion attached at its center to said support member, said annular mounting portion further comprising a circumferential fluid passage disposed therein.

2. The apparatus of claim 1 further comprising:
   a cross member extending radially inward from the annular mounting portion and coupled to said support member.

3. The apparatus of claim 2 wherein said cross member and said support member are copper.

4. The apparatus of claim 1 wherein said shield is copper.

5. The apparatus of claim 1 wherein said shield has a thermally reflective finish.

6. The apparatus of claim 1 wherein said shield is metal plated.

7. The apparatus of claim 1 wherein said shield is plated with a material selected from the group consisting of nickel, gold and silver.

8. The apparatus of claim 1 wherein said mounting portion further comprises:
   a first sealing surface disposed on a first face of said mounting portion; and,
   a second sealing surface disposed on a second face of said mounting portion, wherein said first and said second sealing surfaces are disposed radially inwards of said fluid passages.

9. The apparatus of claim 8 wherein said mounting portion is copper.

10. The apparatus of claim 8 wherein said first and said second sealing surfaces are stainless steel, each sealing surface further comprising a knife edge.

11. The apparatus of claim 1 wherein said circumferential fluid passage further comprises:
    a channel disposed in a face of said mounting portion; and,
    a plug disposed in said channel flush with said face.

12. The apparatus of claim 1, wherein said process chamber further comprises:
    a port, where is mounting portion is affixed to said port and said shield is positioned proximate said port.

13. The apparatus of claim 12 further comprising:
    a cryo pump in communication with said chamber through said port.

14. Apparatus for shielding a device from a process chamber of a semiconductor wafer processing system, comprising:
    a shield disposed within said process chamber;
    a thermally conductive support member attached to sad shield, extending perpendicularly away from said shield; and
    a mounting portion disposed outside said process chamber, connected to said shield, said mounting portion having sealing surfaces and a circumferential, internal fluid passage, said sealing surfaces disposed radially inwards of said fluid passage.

15. The apparatus of claim 14 further comprising:
    a cross member coupled to said mounting portion; and,
    a support rod coupled to said shield.

16. The apparatus of claim 14 wherein said shield is copper.

17. The apparatus of claim 14 wherein said shield has a thermally reflective finish.

18. The apparatus of claim 14 wherein said shield is metal plated.

19. The apparatus of claim 14 wherein said shield is plated with a material selected from the group consisting of nickel, gold and silver.

20. The apparatus of claim 14, wherein said process chamber further comprises:
    a port, where is mounting portion is affixed to said port and said shield is positioned proximate said port.

21. The apparatus of claim 14 further comprising:
    a cryo pump in communication with said chamber through said port.

22. Apparatus for shielding a device from a process chamber within a semiconductor wafer processing system, comprising:
    a chamber having a port;
    a cryo pump coupled to said port;
    a pedestal disposed within said chamber;
    a thermally reflective shield disposed within said chamber between said pedestal and said port; and
    a mounting portion, disposed between said port and said cryo pump, said mounting portion connected to said shield and having a fluid passage external to the process chamber positioned radially outwards of a sealing surface of said mounting portion.

* * * * *

UNITED STATES PATENT AND TRADEMARK OFFICE
CERTIFICATE OF CORRECTION

PATENT NO. : 6,620,250 B2
DATED : September 16, 2003
INVENTOR(S) : Brezoczky et al.

It is certified that error appears in the above-identified patent and that said Letters Patent is hereby corrected as shown below:

Column 1,
Line 9, please change "513;277" to -- 513,277 --.

Column 8,
Line 16, please change "sad" to -- said --.
Line 52, after "said port;" and before "and", please add:
-- a thermally conductive support member attached to said shield, extending perpendicularly away from said shield; --

Signed and Sealed this

Twenty-second Day of June, 2004

JON W. DUDAS
*Acting Director of the United States Patent and Trademark Office*